(12) United States Patent
Bohnstingl et al.

(10) Patent No.: US 11,430,524 B2
(45) Date of Patent: Aug. 30, 2022

(54) METHOD FOR DESIGNING AN INITIALIZATION FUNCTION FOR PROGRAMMING A MEMORY ELEMENT

(71) Applicant: International Business Machines Corporation, Armonk, NY (US)

(72) Inventors: Thomas Bohnstingl, Thalwil (CH); Angeliki Pantazi, Thalwil (CH); Stanislaw Andrzej Wozniak, Kilchberg (CH); Evangelos Stavros Eleftheriou, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/085,071

(22) Filed: Oct. 30, 2020

(65) Prior Publication Data

US 2022/0139464 A1     May 5, 2022

(51) Int. Cl.
| | |
|---|---|
| *G11C 16/20* | (2006.01) |
| *G11C 16/26* | (2006.01) |
| *G06N 3/063* | (2006.01) |
| *G11C 16/32* | (2006.01) |
| *G11C 16/34* | (2006.01) |
| *G11C 16/30* | (2006.01) |

(52) U.S. Cl.
CPC ............ *G11C 16/20* (2013.01); *G06N 3/063* (2013.01); *G11C 16/26* (2013.01); *G11C 16/30* (2013.01); *G11C 16/32* (2013.01); *G11C 16/3481* (2013.01)

(58) Field of Classification Search
CPC ......... G11C 16/20; G11C 16/26; G11C 16/30; G11C 16/32; G11C 16/3481; G06N 3/063
See application file for complete search history.

(56) References Cited

U.S. PATENT DOCUMENTS

| | | | |
|---|---|---|---|
| 9,190,171 B2 | 11/2015 | Papandreou | |
| 9,208,875 B2* | 12/2015 | Lee | ............ G11C 11/5678 |
| 10,079,058 B1 | 9/2018 | Eleftheriou | |
| (Continued) | | | |

FOREIGN PATENT DOCUMENTS

CN     110163016 A     8/2019

OTHER PUBLICATIONS

Athmanathan et al., "Multilevel-Cell Phase-Change Memory: A Viable Technology", IEEE Journal on Emerging and Selected Topics In Circuits and systems, vol. 6, No. 1, Mar. 2016, pp. 1-14, <http://www.ieee.org/publications_standards/publications/rights/index.html>.

(Continued)

*Primary Examiner* — Vanthu T Nguyen
(74) *Attorney, Agent, or Firm* — Alexander G. Jochym

(57) ABSTRACT

The present disclosure relates to a storage device comprising a memory element. The memory element may comprise a changeable physical quantity for storing information. The physical quantity may be in a drifted state. The memory element may be configured for setting the physical quantity to an initial state. Furthermore, the memory element may comprise a drift of the physical quantity from the initial state to the drifted state. The initial state of the physical quantity may be computable by means of an initialization function. The initialization function may be dependent on a target state of the physical quantity and the target state of the physical quantity may be approximately equal to the drifted state of the physical quantity.

15 Claims, 9 Drawing Sheets

(56) References Cited

U.S. PATENT DOCUMENTS

| | | |
|---|---|---|
| 2014/0219014 A1 | 8/2014 | Lee |
| 2015/0049548 A1* | 2/2015 | Park .................... G11C 11/5642 |
| | | 365/185.11 |
| 2015/0103589 A1* | 4/2015 | Lee ..................... G11C 11/5678 |
| | | 365/163 |
| 2018/0075344 A1 | 3/2018 | Ma |
| 2019/0043571 A1 | 2/2019 | Damle |
| 2020/0334525 A1 | 10/2020 | Tsai |

OTHER PUBLICATIONS

Benjamin et al., "Neurogrid: A Mixed-Analog-Digital Multichip System for large-Scale Neural Simulations", © 2014 IEEE, vol. 102, No. 5, May 2014, pp. 1-18, <http://www.ieee.org/publications_standards/publications/rights/index.html>.

Cobley et al., "A Model for Multilevel Phase-Change Memories Incorporating Resistance Drift Effects", IEEE Journal of the Electron Devices Society, vol. 3, Issue 1, Jan. 2015, pp. 1-9, <https://ieeexplore.ieee.org/document/6897913>.

Davies et al., "Liohi: A Neuromorphic Manycore Processor with On-Chip Learning", IEEE Micro Jan./Feb. 2018, Published by the IEEE Computer Society 0272-1732 © 2018 IEEE, pp. 1-18, <www.computer.org/micro>.

Ji et al., "Bridging the Gap Between Neural Networks and Neuromorphic Hardware with a Neural Network Compiler", arXiv:1801.00746v3 [cs.NE] Jan. 18, 2018, pp. 1-13, <https://arxiv.org/pdf/1801.00746.pdf>.

Le Gallo et al., "Compressed Sensing With Approximate Message Passing Using In-Memory Computing", IEEE Transactions on Electron Devices, ©2018 IEEE, pp. 1-9, <http://www.ieee.org/publications_standards/publications/rights/index.html>.

Lee et al., "UNPU: An Energy-Efficient Deep Neural Network Accelerator with Fully Variable Weight Bit Precision", IEEE Journal of Solid-state Circuits, vol. 54, Issue: 1, Jan. 2019, pp. 1-13.

Merolla et al., "A Million Spiking Neuron Integrated Circuit With a Scalable Communication Network and Interface", Science AAAS, Science 345, 668 (2014); DOI: 10.1126/Science. 1254642, Aug. 8, 2014, vol. 345 Issue 6197, pp. 1-7.

Microsoft Docs, "Horizontal, vertical, and functional data partitioning", Nov. 4, 2018, Data partitioning guidance—Best practices for cloud applications, Accessed on Apr. 6, 2020, pp. 1-12, <https://docs.microsoft.com/en-us/azure/architecture/best-practices/data-partitioning>.

Nandakumar et al., "Mixed-precision architecture bases on computational memory fortraining deep neural networks", © 2018 IEEE, 978-1-5386-4881-0/18, pp. 1-5.

Papadomanolakis et al., "AutoPart: Automating Schema Design for Large Scientific Databases using Data Partitioning", Proceedings of the 16th International Conference on Scientific and Statistical Database Management (SSDBM'04) 1099-3371/04k © 2004 IEEE Computer Society, pp. 1-10.

Pei et al., "Towards artificial general intelligence with hybrid Tianjic chip architecture", 106 Nature, vol. 572, Aug. 1, 2019, pp. 1-19, <https://doi.org/10.1038/s41586-019-1424-8>.

Schemmel et al., "A Wafer-Scale Neuromorphic Hardware System for Large-Scale Neural Modeling", 978-1-4244-5309-2/10 © 2010 IEEE, pp. 1-4.

Sebastian et al., "Multi-Level Storage in Phase-Change Memory Devices", European Symposium on Phase Change and Ovonic Science E/PCOS 2016, pp. 1-6.

Wozniak et al., "Deep Learning Incorporating Biologically Inspired Neural Dynamics and In -Memory Computing", Nature Machine Intelligence, Jun. 15, 2020, pp. 1-20, <https://doi.org/10.1038/s42256-020-0187-0>.

Wozniak et al., "Deep Networks Incorporating Spiking Neural Dynamics", arXiv:1812.07040v1 [cs.NE] Dec. 17, 2018, pp. 1-9, <https://arxic.org/pdf/1812.07040.pdf>.

IBM Appendix P., "List of IBM Patents or Patent Applications to be Treated as Related", Dated Herewith, 2 pages.

Pantazi et al., "Integrated Circuit With a Configurable Neuromorphic Neuron Apparatus for Artificial Neural Networks", U.S. Appl. No. 17/085,173, filed Oct. 30, 2020, 76 Pages.

Deng et al., "Tianjic a unified and Scalable Chip Bridging Spike-based and Continuous Neural Computation", IEEE Journal of Solid-State Circuits, vol. 55, No. 8, Aug. 2020, 19 pages.

Sebastian et al., "Memory devices and applications for in-memory computing", IBM Research, vol. 15, Jul. 2020, 16 pages.

"Patent Cooperation Treaty PCT Notification of Transmittal of the International Search Report and the Written Opinion of the International Searching Authority, or the Declaration", Applicant's file reference P201909399, International application No. PCT/EP2021/078954, International filing date Oct. 19, 2021 (Oct. 19, 2021), dated Jan. 31, 2022 (dated Jan. 31, 2022), 19 pages.

"Patents Act 1977: Combined Search and Examination Report under Sections 17 and 18(3)", Applicant's file reference DP/P49691GB, International application No. GB2114411.8, Date of Report Mar. 22, 2022, 8 pages.

\* cited by examiner

| | | |
|---|---|---|
| $G_{init\_1}$ | $G_{act\_1}$ | |
| $G_{init\_2}$ | $G_{act\_2}$ | 600 |
| $G_{init\_i}$ | $G_{act\_i}$ | |
| $G_{init\_n}$ | $G_{act\_n}$ | |

METHOD FOR DESIGNING AN INITIALIZATION FUNCTION FOR PROGRAMMING A MEMORY ELEMENT

STATEMENT REGARDING PRIOR DISCLOSURES BY THE INVENTOR OR A JOINT INVENTOR

The following disclosure(s) are submitted under 35 U.S.C. 102(b)(1)(A): DISCLOSURE(S): Deep Learning Incorporating Biologically Inspired Neural Dynamics and in-memory computer, Stanislaw Wozniak, Angeliki Pantazi, Thomas Bohnstingl & Evangelos Eleftheriou, Jun. 15, 2020, pages 325-336.

BACKGROUND

The invention relates in general to the field of semiconductor memory devices.

Semiconductor memory devices can be grouped into volatile memory devices, such as dynamic random-access memory (DRAM) cells, and non-volatile memory devices, such as phase-change memory (PCM) and resistive random access memory (RRAM) devices. Research in the field of memory devices is amongst others directed to high endurance, data retention, low write and read latency and reliability. The research in the field of memory devices may also account for possibilities of multilevel-cell operations with respect to the memory devices for storing more than one bit of information per memory cell.

SUMMARY

Various embodiments provide a storage device, an integrated circuit, a method for setting-up a storage device and a method for designing an initialization function as described by the subject matter of the independent claims. Advantageous embodiments are described in the dependent claims. Embodiments of the present invention can be freely combined with each other if they are not mutually exclusive.

In one aspect, the invention relates to a storage device comprising a memory element. The memory element may comprise a changeable physical quantity for storing an information. The physical quantity may be in a drifted state. The memory element may be configured for setting the physical quantity to an initial state. Furthermore, the memory element may comprise a drift of the physical quantity from the initial state to the drifted state. The initial state of the physical quantity may be computable by means of an initialization function. The initialization function may be dependent on a target state of the physical quantity and the target state of the physical quantity may be approximately equal to the drifted state of the physical quantity.

In another aspect, the invention relates to an integrated circuit comprising a first assembly of memory elements. The first assembly of memory elements may comprise connections for applying corresponding voltages to the respective connections to generate single electric currents in the respective memory elements. Furthermore, the first assembly may comprise at least one output connection for outputting an output electric current. The memory elements may be connected to each other such that the output electric current is a sum of the single electric currents. The integrated circuit may be configured to generate the output electric current on the basis of the applied voltages. Furthermore, each memory element may comprise a respective changeable conductance, wherein the respective conductance may be in a respective drifted state. The respective memory element may be configured for setting the respective conductance to a respective initial state. In addition, the respective memory element may comprise a respective drift of the respective conductance from the respective initial state to the respective drifted state. The respective initial state of the respective conductance may be computable by means of a respective initialization function. The respective initialization function may be dependent on a respective target state of the respective conductance and the respective target state of the respective conductance may be approximately equal to the respective drifted state of the respective conductance.

In another aspect, the invention relates to a method for setting-up a storage device comprising a memory element, the memory element comprising a changeable physical quantity. The method comprises
selecting a target state of the physical quantity;
computing an initial state of the physical quantity using an initialization function, the initialization function being dependent on the target state of the physical quantity;
setting the physical quantity to the computed initial state of the physical quantity.

In another aspect, the invention relates to a method for designing an initialization function. The initialization function may represent a relationship between a respective selected target state of a changeable physical quantity of a memory element and a corresponding initial state of the physical quantity of the memory element. The physical quantity of the memory element may be adjustable to the corresponding initial state of the physical quantity for drifting in direction to the respective selected target state of the physical quantity. The method comprises setting the physical quantity of the memory element to an initial value at an initial point of time in a first step; measuring an actual value of the physical quantity of the memory element after an elapsed given period of time in a second step, wherein the elapsed given period of time starts from the initial point of time; storing the initial value and the actual value of the physical quantity in a database in a third step; repeating the first, second and third step and setting the physical quantity of the memory element to a different initial value at each repetition of the first step for storing several different pairs of the initial and the actual value of the physical quantity in the database; designing the initialization function on the basis of the database.

In another aspect, the invention relates to a computer program product comprising a computer-readable storage medium having computer-readable program code embodied therewith, the computer-readable program code configured to implement all of steps of the method for setting-up a storage device or for designing an initialization function.

BRIEF DESCRIPTION OF THE SEVERAL VIEWS OF THE DRAWINGS

In the following embodiments of the invention are explained in greater detail, by way of example only, making reference to the drawings in which.

DETAILED DESCRIPTION

Figure 1:
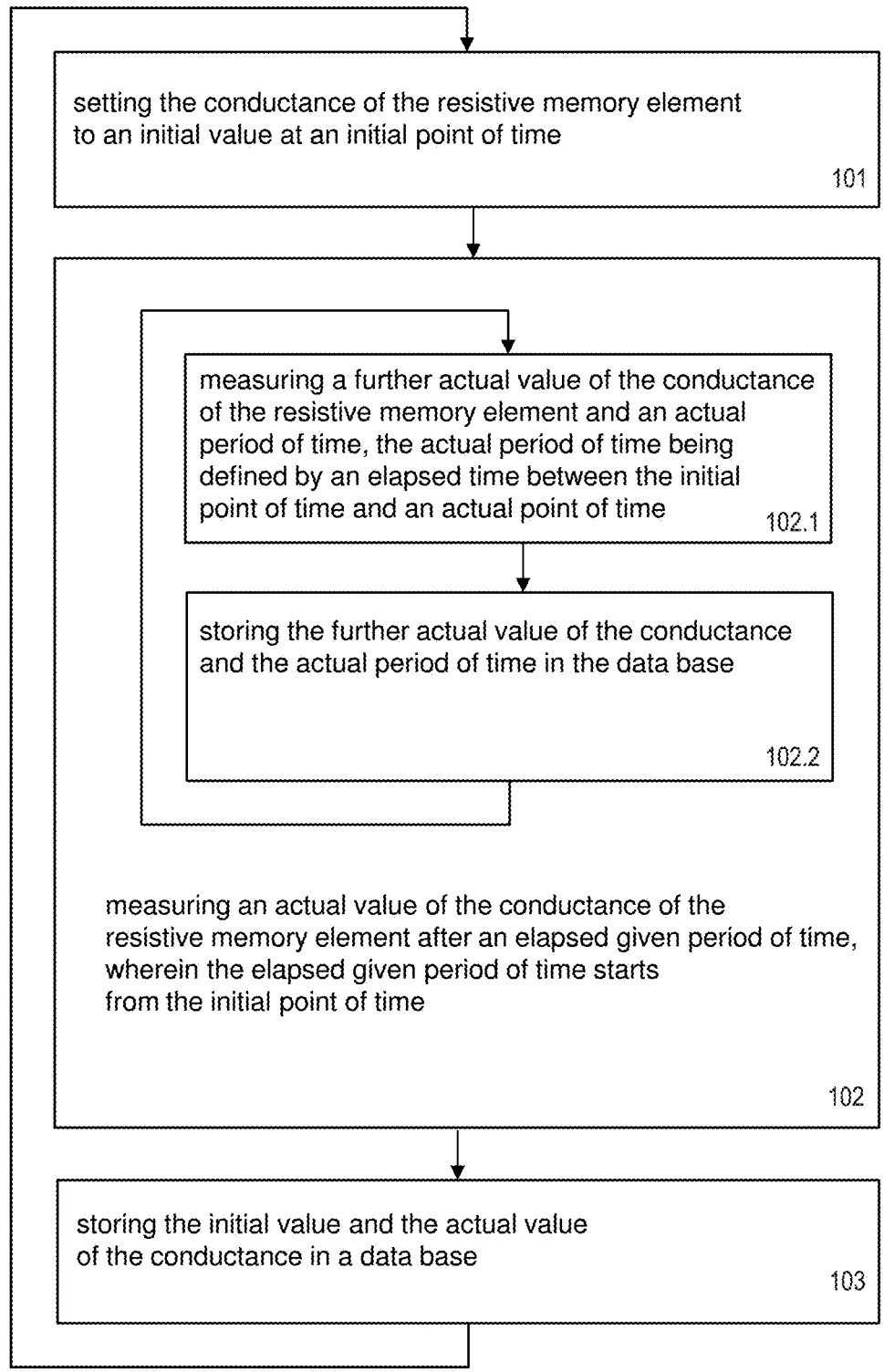
FIG. 1 is a flowchart of a method for designing an initialization function in accordance with the present subject matter.

The descriptions of the various embodiments of the present invention will be presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The memory element may be a capacitor, a resistor or a resistive memory element, also referred to as a memristor in the following. The memristor may be a phase change memory (PCM) element, metal-oxide resistive RAM element, conductive bridge RAM element or a magnetic RAM element. In case, the memory element may be the capacitor, the physical quantity may be an electrical charge. The charge may be changeable by charging the capacitor. In case, the memory element may be a memristor, the physical quantity may be the conductance of the resistive memory element (RME). The conductance of the RME may be changeable by applying a control voltage to the RME.

A value of the physical quantity, i.e. a state of the physical quantity, may correspond to a stored information, for example a value of a variable. For example, a higher value of the physical quantity may correspond to a higher value of the variable and vice versa. In another example, a lower value of the physical quantity may correspond to a higher value of the variable and vice versa. The stored information may be a value, for example a value of a variable. The value may be an entry of a matrix. The physical quantity may be the conductance, the charge or a resistance of the memory element.

The initial state of the physical quantity may be a state of the physical quantity directly after programming the memory element. Hence, a programming of the memory element may be considered as setting the physical quantity to the initial state. The setting of the physical quantity may be performed by applying a programming voltage or a programming current to the memory element.

The term "drift" as used herein describes a change of a value of the physical quantity over time such as a decay or a growth of the physical quantity over time. The term "drifted state" as used herein describes a changed state of the physical quantity compared to the initial state. Between a point of time when the physical quantity is in the initial state and a further point of time when the physical quantity is in the drifted state time has passed. Furthermore, in the drifted state of the physical quantity of the memory element the change of the physical quantity over time may be less than a change of the physical quantity over time in the initial state of the physical quantity. For this reason, an information which may be represented by an actual value of the physical quantity of the memory element may be kept over time with a higher precision if the physical quantity is in the drifted state. In one example, the change of the physical quantity over time in the drifted state of the physical quantity may be less than ten percent compared to a change of the physical quantity over time in the initial state of the physical quantity. In another example, the change of the physical quantity over time in the drifted state of the physical quantity may be less than five, or according to a further example less than one, percent compared to the change of the physical quantity over time in the initial state of the physical quantity.

Hence, after setting the physical quantity to an initial value, a change over time of the physical quantity reduces as time passes. This effect was observed to be dependent of the initial value of the physical quantity in experiments. The present storage device may be configured for setting the physical quantity of the memory element to the initial state, and use it after the physical quantity may have reached the drifted state. Thus, the present storage device provides a storage device using a memory element with a higher precision compared to a standard use case. The standard use case may comprise programming the physical quantity of the memory element, for example the conductance of the memristor, to the initial state and use the memory element, for example the memristor, directly afterwards.

The initial state or value of the physical quantity may be computed by means of the initialization function using a computer, for example a look-up table. In another example, the physical quantity may be computed by means of the initialization function in a manual manner.

This advantage may be as well useful for an application, wherein the above mentioned respective RMEs may be used to generate the above mentioned single electric currents. In on example, the voltages may be applied in the form of voltage pulses with a constant voltage but with different lengths or number of the pulses within a time interval for performing a pulse width modulation in order to generate the single electric currents. In a further example, the voltages may be applied comprising different voltage values of at least two of the voltages in order to generate the single electric currents. The voltages may be applied by means of a voltage source or a current source. The output electric current, which may be generated as a sum of the single electric currents, may be generated with a higher precision. Hence, the respective RMEs with their respective conductance being in the respective drifted state may be used to perform a more accurate addition on a hardware level. This may be especially advantageous for the following application.

According to one embodiment, the integrated circuit may further comprise a neuromorphic neuron apparatus for simulating a layer of a neural network. In this embodiment, the neuromorphic neuron apparatus may comprise an input connection, wherein the input connection may be connected to the output connection of the first assembly. Herein, the generated output electric current may be used as an input signal for the neuromorphic neuron apparatus. With the RMEs working at a higher precision, the input signal for the neuromorphic neuron apparatus may be more accurate. Hence, the neuromorphic neuron apparatus may deliver better results when being applied to inference tasks.

According to one embodiment, the respective target state of the physical quantity of the corresponding memory element may be adapted to a usage of the integrated circuit. The usage may refer to a point of time when the memory element may be used. If that point of time is known, the physical quantity of the memory element may initially be set such that the physical quantity of the memory element may reach the target state at that point of time.

Making use of the knowledge of the state-dependent behavior of the drift of the physical quantity after programming the memory element may also be beneficial for the above described method of setting-up the storage device. As the initialization function may be used for computing the initial state of the physical quantity and the initialization function depends on the target state of the physical quantity, the storage device may be set up to run more precisely after the physical quantity reached the drifted state.

According to one embodiment of the method for setting-up the storage device, the method may further comprise measuring an elapsed time from an initial point of time of setting the physical quantity to the computed initial state of the physical quantity to an actual point of time. The method may further comprise comparing the measured elapsed time with a given period of time, wherein the given period of time may depend on a usage of the memory element. Furthermore, the method may comprise releasing the memory element for operation if the measured elapsed time is greater than the given period of time. This embodiment may enable to secure that the storage device may only be used after the given period of time has passed after programming the memory element of the storage device. In other words, this embodiment prevents a usage of the storage device with a comparable low precision.

According to one embodiment of the method for designing the initialization function, the measuring of the actual value of the physical quantity of the memory element in the second step may be performed at a first point of time, wherein a time span between the initial point of time and the first point of time is equal to the given period of time. As the second step may be repeated for storing the several different pairs of the initial and the actual value of the physical quantity in the database, this embodiment may enable to retrieve the values for the database such that the time span between the initial point of time and the point of time of the measurement of the actual value of the physical quantity is the same for each pair. This alleviates to design the initialization function as a time-independent function.

According to one embodiment of the method for designing the initialization function, the given period of time may be adapted to a future usage of the memory element. The future usage may comprise a future point of time of usage of the memory element. If the future point of time of usage is known, the memory element may be programmed such that the physical quantity may reach its target state almost exactly at the future point of time of usage after having drifted from the programmed value.

According to one embodiment of the method for designing the initialization function, the measuring of the actual value of the physical quantity of the memory element in the second step may be performed if a change over time of the actual value of the physical quantity is below a given threshold. If the initialization function may be designed in such a manner, the initial physical quantity may be computable by using the initialization function such that the physical quantity may comprise a change over time in the drifted state of the physical quantity which may be comparable to the threshold or may be less than the threshold. Hence, the endurance of the memory element may be enhanced by this embodiment.

According to one embodiment of the method for designing the initialization function, the initialization function may be independent of time. This embodiment may provide the initialization function as a very practical function as no measurements of time need to be made, neither for considering a point of time of usage, nor during the usage.

According to one embodiment of the method for designing the initialization function, the initialization function may be a power function comprising the respective selected target state of the changeable physical quantity as an exponent of the power function and the corresponding initial state of the physical quantity as a function value of the power function. This embodiment may reflect very accurately observations done by performing experiments referring to the drift of the physical quantity of memory elements. Thus, using the initialization function as a power function may deliver more accurate results when setting up the physical quantity using the initialization function.

According to one embodiment of the method for designing the initialization function, the initialization function may be equal to: $f(G)=a*e^{-b*G}+c$, wherein G is the respective selected target state of the changeable physical quantity, $f(G)$ is the corresponding initial state of the physical quantity and a, b and c are coefficients of the initialization function. This embodiment may represent very accurately observations made by performing several further experiments referring to the drift of the physical quantity of memory elements. Thus, using the initialization function according to this embodiment may result in higher accuracy of the initialization function.

According to one embodiment of the method for designing the initialization function, the method may further comprise measuring a further actual value of the physical quantity of the memory element and an actual period of time, the actual period of time being defined by an elapsed time between the initial point of time and an actual point of time in a sub-step of the second step; storing the further actual value of the physical quantity and the actual period of time in the database in a further sub-step of the second step; repeating the sub-step and the further sub-step of the second step while time elapses from the initial point of time for storing several different further actual values of the physical quantity and corresponding actual periods of time in the database; designing the initialization function on the basis of the database.

This embodiment may enable to design a time-dependent initialization function. If the initialization function is time-dependent the physical quantity may be set up more accurately with respect to the future usage, for example with respect to the future point of time of usage of the memory element. In addition, this embodiment may be beneficial in a sense that the most possible amount of data may be gained when experiments with respect to the drift of the memory element may be performed.

According to a further embodiment of the method for designing the initialization function, the method may further comprise designing a corresponding time-dependent initialization function for each initial value of the physical quantity. The corresponding time-dependent initialization function may represent a time-dependent drift of the physical quantity of the memory element starting from the corresponding initial state of the physical quantity of the memory element. According to this embodiment, a set of several initialization functions may be designed on the basis of the database. The several initialization functions may be used for calculating the initial value of the physical quantity by interpolation.

According to a further embodiment of the method for designing the initialization function, the method may further comprise designing the initialization function such that the initialization function may represent the relationship between the respective selected target state of the changeable physical quantity of the memory element and the corresponding initial state of the physical quantity of the memory element and a selected elapsed period of time after setting the physical quantity of the memory element to the corresponding initial state. The selected elapsed period of time may be dependent on a predefined future usage of the memory element. This embodiment may replace the interpolation mentioned above.

Figure 2:
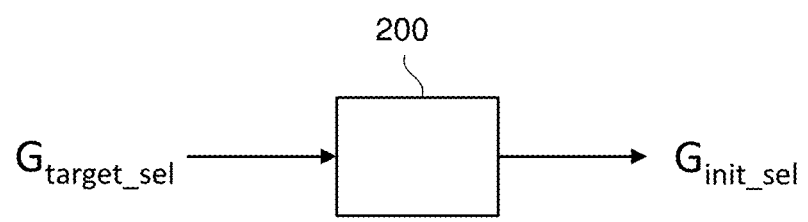
FIG. 2 illustrates a dataflow of the initialization function.

FIG. 1 is a flowchart of a method for designing an initialization function 200 as shown in FIG. 2. The initialization function 200 may represent a relationship between a respective selected target state of a changeable physical quantity $G_{target\_sel}$ of a memory element 300 and a corresponding initial state of the physical quantity $G_{init\_sel}$ of the memory element 300, as shown in FIG. 3.

Figures 7, 8:
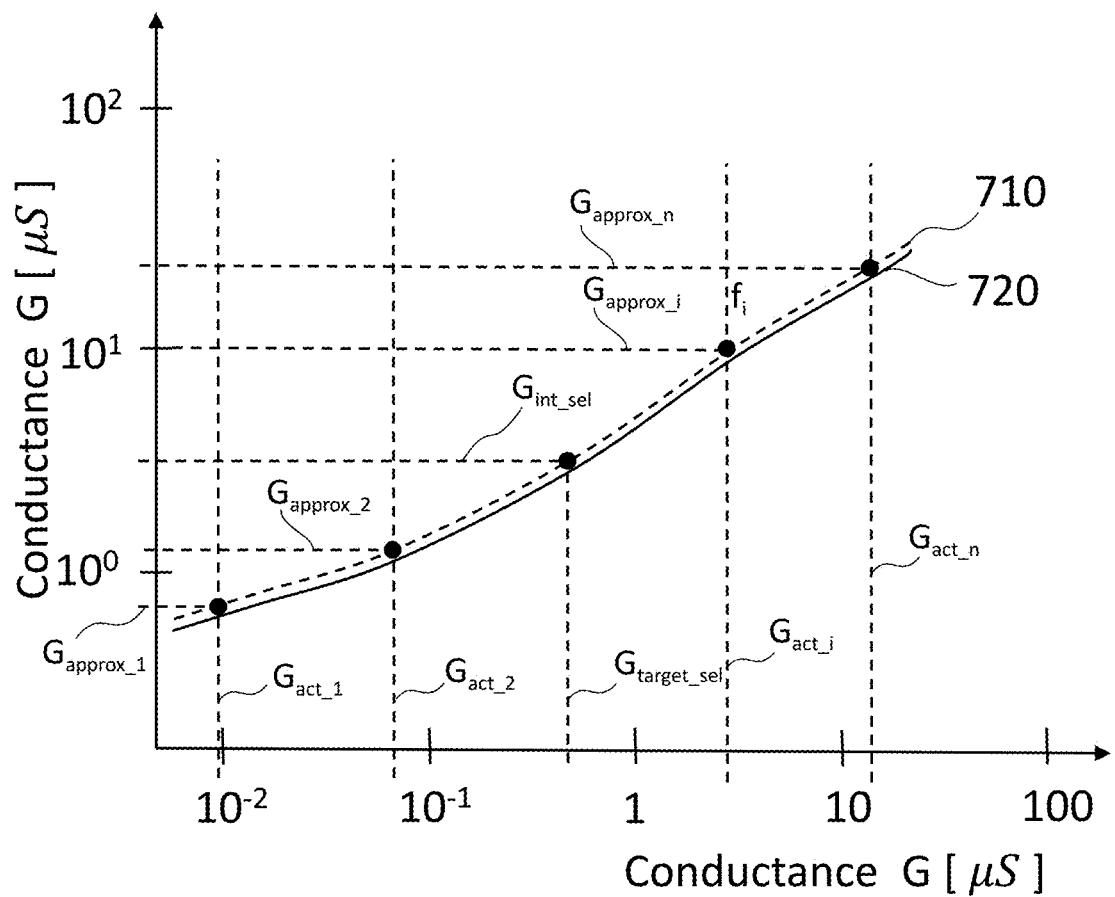
FIG. 7 illustrates a chart comprising the initialization function.
FIG. 8 illustrates a further database comprising sets of further actual values of the physical quantity, each set representing a time sequence of the value of the physical quantity.
Figure 9:
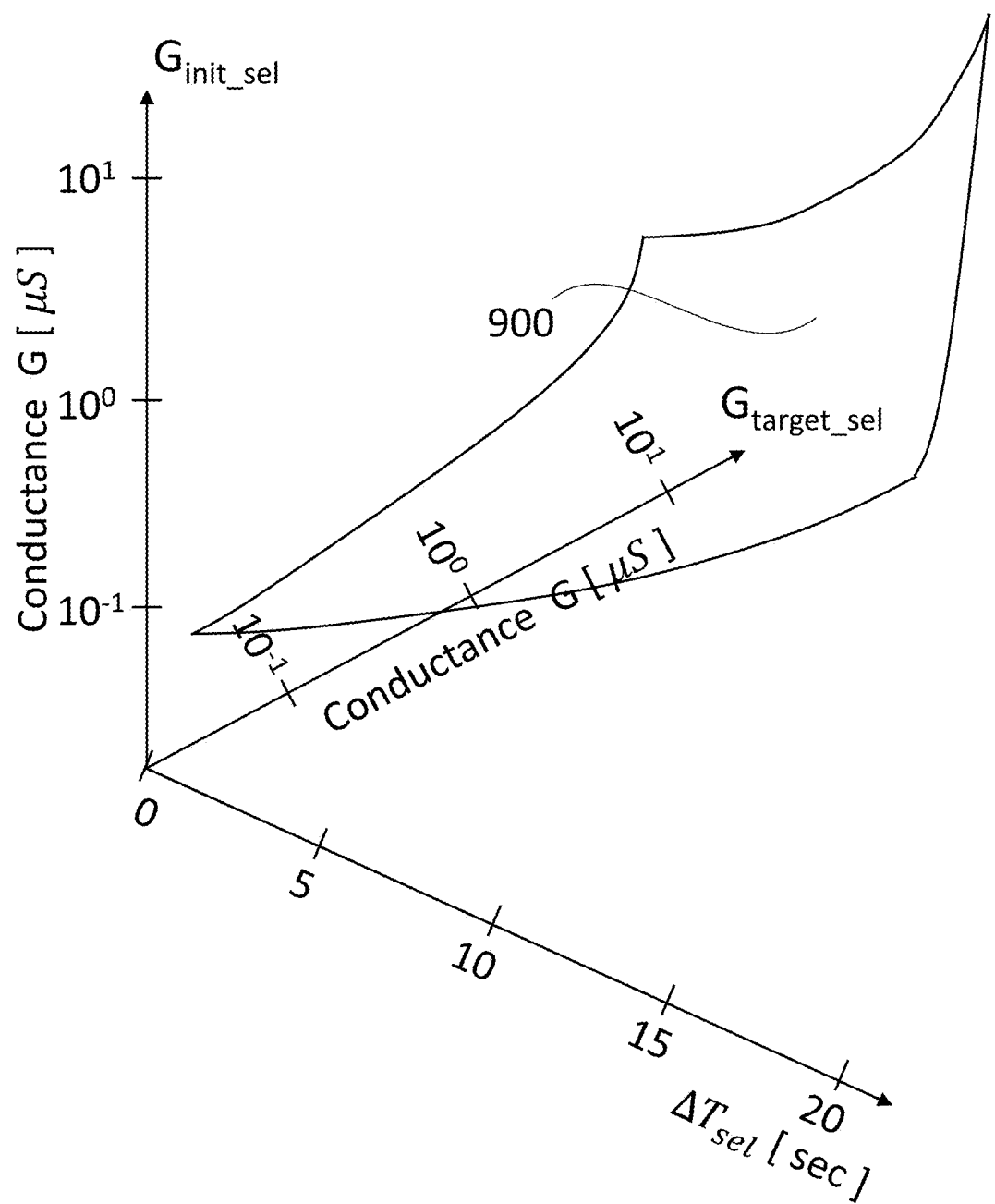
FIG. 9 illustrates a time-dependent initialization function.

One example of the visual representation 720 of initialization function 200 is shown in the chart of FIG. 7 as a solid line. The x-axis of the chart may represent possible values of the selected target state of the physical quantity $G_{target\_sel}$, and the y-axis may represent values of the corresponding initial state of the physical quantity $G_{init\_sel}$, which may each correspond to one of the possible values of the selected target state of the physical quantity $G_{target\_sel}$. A dataflow with respect to the initialization function 200 is shown in FIG. 2. For clarity, only one example of a value of the selected target state of the physical quantity $G_{target\_sel}$ and the corresponding value of the initial state of the physical quantity $G_{init\_sel}$ is shown in the chart in the form of a circle. Generally, the initialization function 200 may be usable for selecting any technically possible value of the target state of the physical quantity $G_{target\_sel}$ and retrieve the corresponding value of the initial state of the physical quantity $G_{init\_sel}$.

Figure 3:
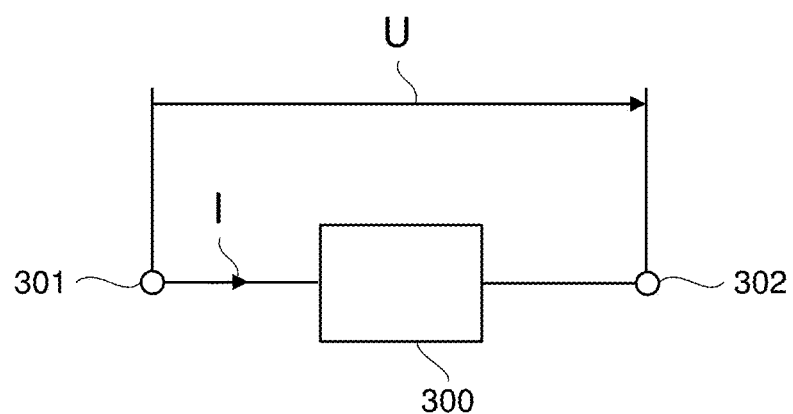
FIG. 3 illustrates a memory element.
Figures 5, 6:
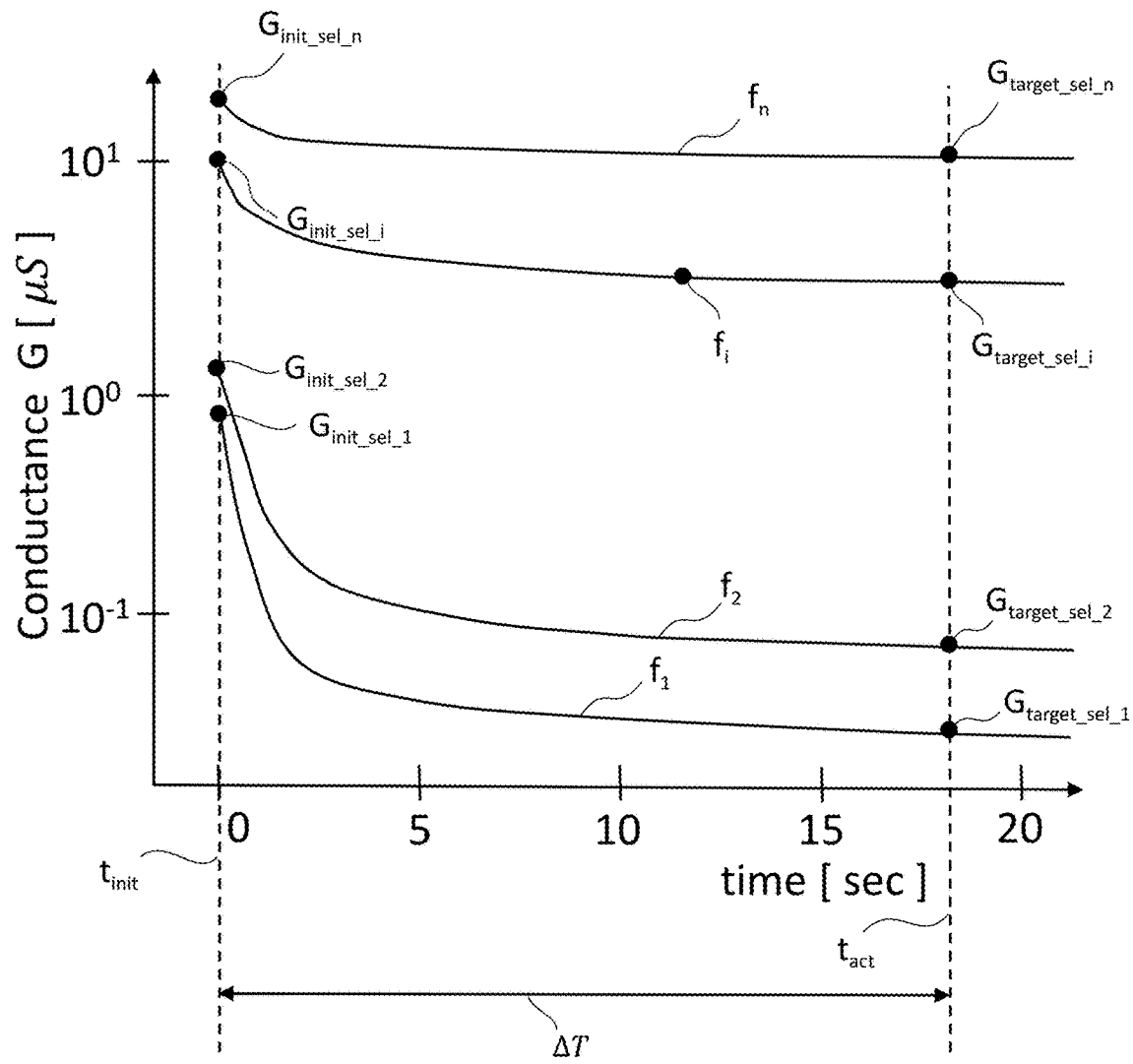
FIG. 5 illustrates a chart comprising curves showing each a drift of a physical quantity over time with respect to a computed initial value of the physical quantity on the basis of a selected target state of the physical quantity of the memory element shown in FIG. 3.
FIG. 6 illustrates a database comprising pairs of the initial value of the physical quantity and a corresponding actual value of the physical quantity.

The memory element 300 may comprise two connections 301, 302 for applying a voltage or a current to adjust the physical quantity, as shown in FIG. 3. The physical quantity of the memory element 300 may be adjustable to the corresponding initial state of the physical quantity $G_{init\_sel\_i}$ for drifting in direction to the respective selected target state of the physical quantity $G_{target\_sel\_i}$. A drift of the physical quantity may take place over time as shown in FIG. 5. FIG. 5 illustrates a respective drift of the physical quantity over time from various different values of the initial state of the physical quantity $G_{init\_sel\_i}$ to a corresponding target state of the physical quantity $G_{target\_sel\_i}$. The values of the physical quantity are drawn in a logarithmic manner with respect to the y-axis of the chart of FIG. 5 and may reflect results of experiments described by the method below. In the example of FIG. 5, the unit of the physical quantity is micro Siemens [µS] and the physical quantity may be the conductance of the memory element 300. The time is shown on the x-axis of the chart. It can be observed that the respective drift of the physical quantity over time varies depending on the value of the initial state of the physical quantity $G_{init\_sel\_i}$.

The method may comprise the following steps. In a first step 101 as shown in FIG. 1, the physical quantity of the memory element 300 may be set to an initial value $G_{init\_1}$ at an initial point of time $t_{init}$. This may be realized by applying a voltage U or a current I between the two connections 301, 302. By applying the voltage U or the current I, the memory element 300 may be programmed, i.e. the memory element 300 may change its internal state, such that the value of the physical quantity changes. For example, a percentage of crystallization of the memory element 300 may change upon applying the voltage U or the current I. In order to set the physical quantity of the memory element to the initial value $G_{init\_1}$, the physical quantity of the memory element 300 may be measured. In response to setting the physical quantity of the memory element to the initial value $G_{init\_1}$, the voltage U or the current I may be disconnected. Disconnecting the voltage U or the current I, may provoke a drift of the physical quantity of the memory element 300 as time passes. This may be caused by thermal effects and/or inherent structural relaxation.

Figure 4:
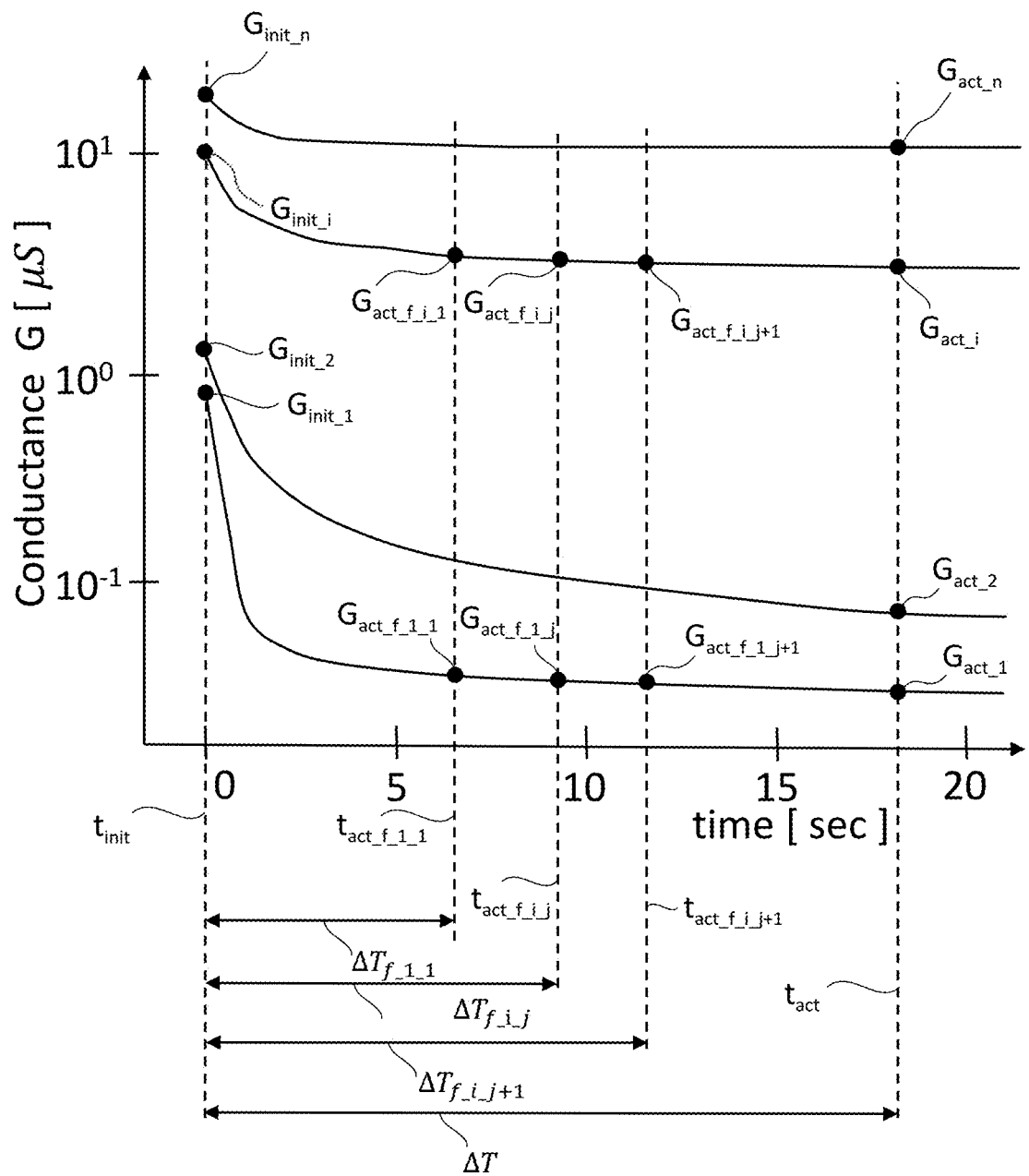
FIG. 4 illustrates a chart comprising curves showing each a drift of a physical quantity over time with respect to an initial value of the physical quantity after programming the memory element shown in FIG. 3.

In a second step 102 as shown in FIG. 2, an actual value of the physical quantity $G_{act\_1}$ of the memory element may be measured after an elapsed given period of time $\Delta T$ in a second step, wherein the elapsed given period of time $\Delta T$ starts from the initial point of time, as shown in FIG. 4. The elapsed given period of time $\Delta T$ ends at an actual point of time $t_{act}$. The actual value of the physical quantity $G_{act\_1}$ of the memory element 300 may be measured at the actual point of time $t_{act}$.

In a third step 103 as shown in FIG. 2, the initial value $G_{init\_1}$ and the actual value of the physical quantity $G_{act\_1}$ may be stored in a database 600 in a third step. These values may be stored in the database 600 as corresponding values, for example in the form of a first dataset of the database 600. The actual value of the physical quantity $G_{act\_1}$ may be stored in the database 600 such that the initial value $G_{init\_1}$ is assigned to the corresponding actual value of the physical quantity $G_{act\_1}$ and vice versa.

The first step 101, the second step 102 and the third step 103 may be repeated several times. At each repetition of the first step the physical quantity of the memory element 300 may be set to a different initial value $G_{init\_i}$. Furthermore, at each repetition, a different pair of the initial value of the physical quantity $G_{init\_i}$ and the actual value of the physical quantity $G_{act\_i}$ may be stored in the database 600 in the form of a further dataset of the database 600 in the repeated third step 103. The different pairs or further datasets are illustrated in the form of rows of the database 600 in FIG. 6.

FIG. 5 illustrates an example of the method, wherein the measuring of the actual value of the physical quantity $G_{act\_i}$ in the second step 102 may be performed at a first point of time, wherein a time span between the initial point of time and the first point of time is equal to the given period of time. Hence, in this example, the actual point of time $t_{act}$ may be the same for each repetition of the second step 102, and may be, in this case, equal to the first point of time.

Practically, the given period of time $\Delta T$ may be adapted to a future usage of the memory element 300. For example, the memory element 300 may be used after a first time span has passed after setting the memory element 300 to the corresponding initial state of the physical quantity $G_{init\_sel}$. The first time span may be equal to the given period of time $\Delta T$ in this example. A usage, i.e. future usage, of the memory element 300 may be in the form of reading out an information stored in the form of the respective selected target state of the physical quantity $G_{target\_sel}$ of the memory element 300 when the physical quantity of the memory element 300 is in the drifted state. In the drifted state the physical quantity of the memory element 300 is approximately equal to the selected target state of the physical quantity $G_{target\_sel}$ of the memory element 300. More specifically, the memory element 300 may be used at a point of time of usage, at which a time span between a point of time of setting the memory element 300 to the corresponding initial state of the physical quantity $G_{init\_sel}$ and the point of time of usage is equal to the given period of time $\Delta T$. In this case, the given period of time $\Delta T$ may be adapted to the point of time of usage.

In another example, the actual point of time tact may differ from one repetition to another repetition of the second step 102. Though, a time span between the actual point of time $t_{act}$ and the initial point of time may be greater than the given period of time $\Delta T$ for each repetition of the second time step 102. This example of the method may comprise to choose the actual point of time $t_{act}$ for the measuring in step 102 such that a change over time of the actual value of the physical quantity $G_{act\_i}$ is below a given threshold.

In a further step 104 as shown in FIG. 1, the initialization function 200 may be designed on the basis of the database 600. A designing of the initialization function 200 may be realized by performing an approximation of a first function 710, shown in FIG. 7. The first function 710 may map each of the actual value of the physical quantity $G_{act\_i}$ to the corresponding initial value of the physical quantity $G_{init\_i}$. The first function 710 may be discrete and may be derived from the database 600. In one example, the first function 710 may only comprise the values stored in the database 600 as admissible arguments and function values. In other words, the approximation may be performed on the basis of the values stored in the database 600. Hence, the first function 710 may be fully described by the values stored in the database 600. For clarity, the first function 710 is shown as a dotted line in the chart of FIG. 7. As well, for clarity reasons, the visual representation 720 of initialization function 200 is drawn below the first function 710. Generally, the approximation may be performed such that the initialization function 200 may comprise the values stored in the database 600. Thus, in most cases, the visual representation 720 of initialization function 200 may match the first function 710 shown in the chart of FIG. 7.

The initialization function 200 may map each actual value of the physical quantity $G_{act\_i}$ to a corresponding approximated value of the physical quantity $G_{approx\_i}$. Each approximated value of the physical quantity $G_{approx\_i}$ may approximate the respective initial value of the physical quantity $G_{init\_i}$ which corresponds to the respective actual value of the physical quantity $G_{act\_i}$. The initialization function 200 may comprise parameters to approximate the first function 710. For example, the initialization function 200 may be a polynomial and may be described as follows: $f(G_{act\_i}) = \Sigma_{j=0}^{n} (\alpha_j * G_{act\_i}^j)$, wherein $f(G_{act\_i})$ may be the approximated value of the physical quantity $G_{approx\_i}$ and $\alpha_j$ may be an j-th parameter or coefficient of the polynomial.

The approximation of the first function 710 may be performed such that a root mean square error, which may be built by using all of the approximated values of the physical quantity $G_{approx\_i}$ and the respective initial value of the physical quantity may be reduced. The initialization function 200 may be provided by a trained neural network. The trained neural network may approximate the first function 710.

In one example, the initialization function 200 may be independent of time. According to a further example, the initialization function 200 may be a power function comprising the respective selected target state of the changeable physical quantity $G_{target\_sel}$ as an exponent of the power function and the corresponding initial state of the physical quantity $G_{init\_sel}$ as a function value of the power function.

For example, the initialization function may be equal to: $f(G) = a*e^{-b*G} + c$, wherein G is the respective selected target state of the changeable physical quantity $G_{target\_sel}$, $f(G)$ is the corresponding initial state of the physical quantity $G_{init\_sel}$ and a, b and c are coefficients of the initialization function.

In a further example, the method may further comprise measuring a further actual value of the physical quantity $G_{act\_f\_1\_1}$ of the memory element and an actual period of time $\Delta T_{f\_1\_1}$, the actual period of time $\Delta T_{f\_1\_1}$ being defined by an elapsed time between the initial point of time and a further actual point of time $t_{act\_f\_1\_1}$ in a sub-step 102.1 of the second step 102. In a further sub-step 102.2 of the second step 102, the further actual value of the physical quantity $G_{act\_f\_1\_1}$ and the actual period of time $\Delta T_{f\_1\_1}$ may be stored in a second database 800, shown in FIG. 8. The second database 800 may comprise the values of the database 600. In one example, the further actual value of the physical quantity $G_{act\_f\_1\_1}$ and the actual period of time $\Delta T_{f\_1\_1}$ may be stored in the database 600.

The sub-step 102.1 and the further sub-step 102.2 of the second step 102 may be repeated while time elapses from the initial point of time. Be repeating the sub-steps 102.1 and 102.2 several different further actual values of the physical quantity $G_{act\_f\_i\_j}$ and corresponding actual periods of time $\Delta T_{f\_i\_j}$ may be stored in the second database 800. With each repetition of the sub-steps 102.1, 102.2 a value of j may increase by one, as illustrated in FIG. 4.

With each repetition of the second step 102 value of i may increase by one. Practically, the corresponding actual periods of time $\Delta T_{f\_i\_j}$ may be the same in each repetition of the second step 102, as shown in FIG. 4. Though, in another example, the corresponding actual periods of time $\Delta T_{f\_i\_j}$ may differ from one repetition of the second step 102 to another.

The further actual values of the physical quantity $G_{act\_f\_i\_j}$ and corresponding actual periods of time $\Delta T_{f\_i\_j}$ may be stored in the database 800 each as a pair of corresponding values. In addition, the further actual values of the physical quantity $G_{act\_f\_i\_j}$ and corresponding actual periods of time $\Delta T_{f\_i\_j}$ may be stored in the database 800 such that the corresponding initial value $G_{init\_i}$ which may be used as a starting point to retrieve further actual values of the physical quantity $G_{act\_f\_i\_j}$ and the corresponding actual periods of time $\Delta T_{f\_i\_j}$ may be assigned to the further actual values of the physical quantity $G_{act\_f\_i\_j}$ and the corresponding actual periods of time $\Delta T_{f\_i\_j}$ and vice versa.

For example, the database 800 may comprise two corresponding rows of data entries for each different initial value $G_{init\_i}$, as shown in FIG. 8. The data entries of the two corresponding rows may comprise the further actual values of the physical quantity $G_{act\_f\_i\_j}$ and the corresponding actual periods of time $\Delta T_{f\_i\_j}$.

Given the second database 800, one or more further initialization functions may be designed on the basis of the second database 800.

In one example, a corresponding time-dependent initialization function $f_i$ may be designed for each initial value of the physical quantity $G_{init\_i}$. The corresponding time-dependent initialization function may represent a time-dependent drift of the physical quantity of the memory element 300 starting from the corresponding initial state of the physical quantity of the memory element 300 $G_{init\_i}$. Each time-dependent initialization function may be designed on the basis of the data entries of the two rows corresponding to the respective initial value of the physical quantity $G_{init\_i}$. The time-dependent initialization functions $f_1, \ldots f_i, \ldots f_n$ are illustrated in FIG. 5.

According to another example, the method may further comprise designing a global initialization function 900. The global initialization function 900 may represent the relationship between the respective selected target state of the physical quantity $G_{target\_sel}$ of the memory element 300 and the corresponding initial state of the physical quantity $G_{init\_sel}$ of the memory element 300 and a selected elapsed period of time $\Delta T_{sel}$ after setting the physical quantity of the memory element to the corresponding initial state $G_{init\_sel}$. The selected elapsed period of time $\Delta T_{sel}$ may be dependent on a predefined future usage of the memory element 300. The global initialization function 900 may comprise the respective selected target state of the physical quantity $G_{target\_sel}$ and the selected elapsed period of time $\Delta T_{sel}$ as arguments and the corresponding initial state of the physical quantity $G_{init\_sel}$ as function value. The designing of the global initialization function 900 may be performed on the basis of the time-dependent initialization functions $f_1, \ldots f_i, \ldots f_n$.

For example, a neural network may be trained using the time-dependent initialization functions $f_1, \ldots f_i, \ldots f_n$ and the corresponding initial value of the physical quantity $G_{init\_i}$. The neural network may comprise a first input, a second input and a first output. In one example, an i-th batch of training datasets for training the neural network may comprise the arguments and function values of the respective time-dependent initialization function $f_i$ and the corresponding initial value of the physical quantity $G_{init\_i}$. During a training of the network the function values of the i-th time-dependent initialization function $f_i$ may each serve as a respective target output value of the first output. Furthermore, the corresponding values of the selected elapsed period of time $\Delta T_{sel}$, i.e. the corresponding arguments of the i-th time-dependent initialization function $f_i$, may be used each as a respective value for the first input. The corresponding initial value of the physical quantity $G_{init\_i}$ may be used as a constant input value of the second input for all changing values of the first input and the first output during the training.

Figure 10:
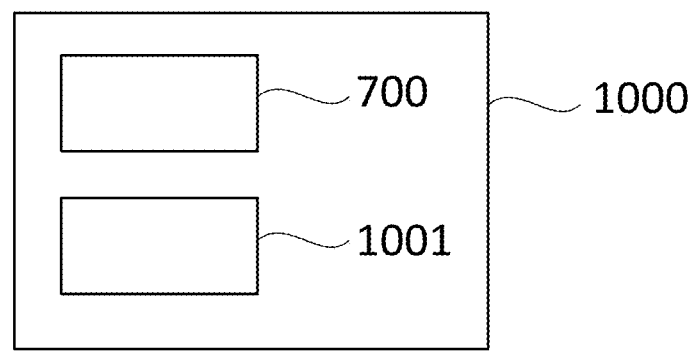
FIG. 10 illustrates an integrated circuit comprising a crossbar array of memristors and a neuromorphic neuron apparatus.
Figure 13:
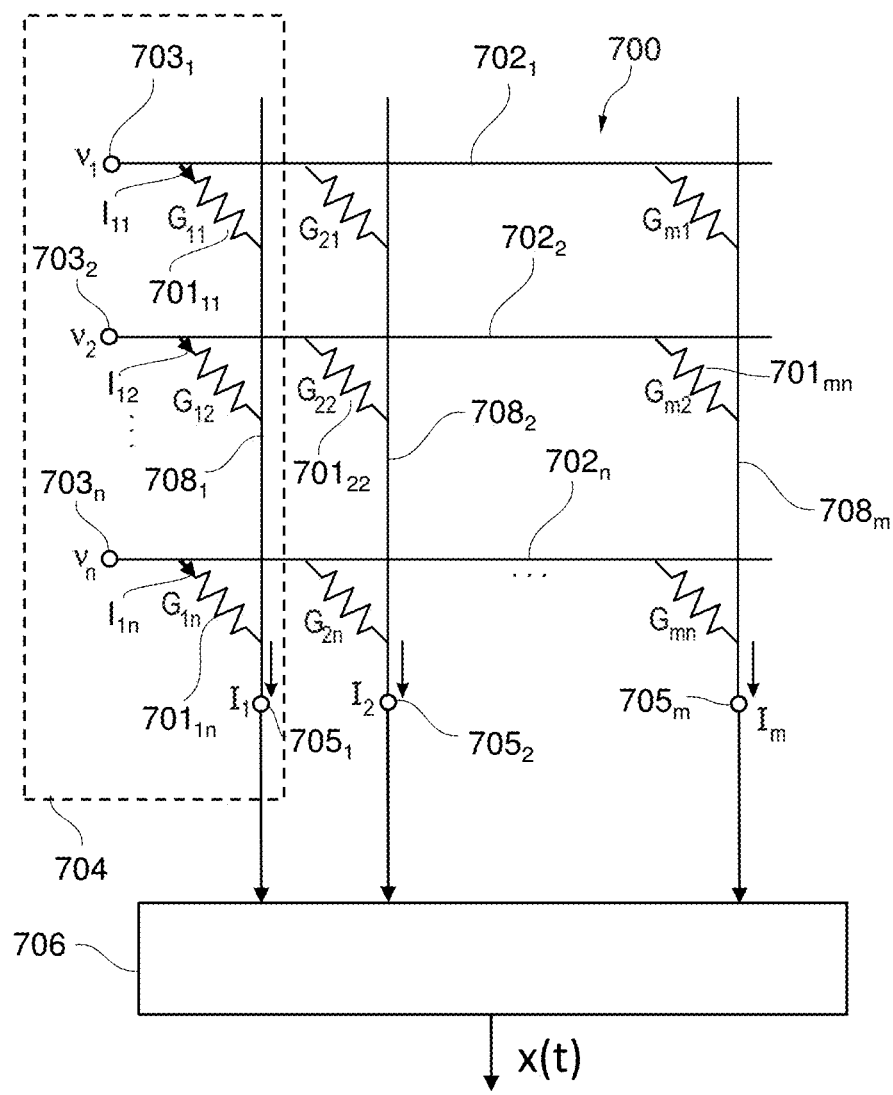
FIG. 13 illustrates the crossbar array of memristors shown in FIG. 10 in more detail.

FIG. 10 depicts an integrated circuit 1000 (IC 1000) comprising a neuromorphic neuron apparatus 1001 (NNA 1001) and a crossbar array 700 of memristors 701 shown in FIG. 13. The IC 1000 may be implemented in the form CMOS circuits. The CMOS circuits may comprise digital and/or analog circuits.

Figure 11:
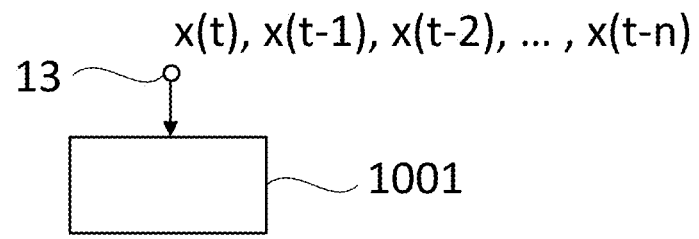
FIG. 11 illustrates a time series of input values of the neuromorphic neuron apparatus shown in FIG. 10.

The NNA 1001 may be configured to receive a stream of input signals x(t-n) ... x(t-3), x(t-2), x(t-1), x(t) as shown in FIG. 11. These input signals may constitute a time series. A current input signal of the NNA 1001 may be the signal x(t). Previously received one or more input signals may be the signals x(t-n) ... x(t-3), x(t-2), x(t-1). Each signal of the input signals may correspond to a value, e.g. a floating-point number. The input signals may be electrical currents if the NNA 1001 is implemented as an analog circuit. The input signals may be binary-coded if the NNA 1001 is implemented in the form of a digital circuit.

Figure 12:
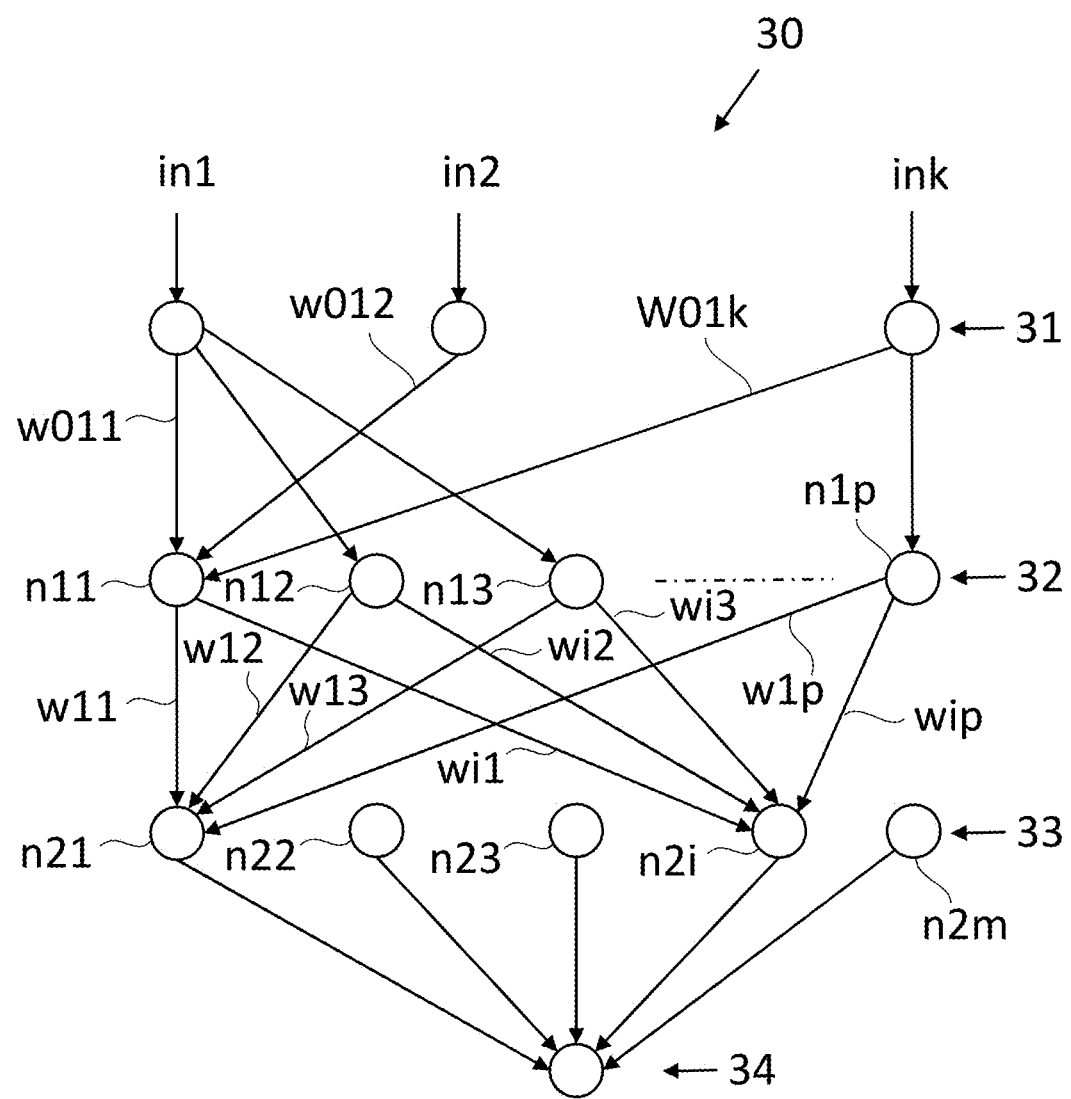
FIG. 12 illustrates a neural network.

FIG. 12 illustrates a neural network 30. The neural network 30 may comprise an input layer 31 comprising k inputs, e.g. input in1, in2, ... ink. Furthermore, the neural network 30 may comprise a first hidden layer 32 comprising p neurons, e.g. neuron n11, n12, n13 ... n1p. Furthermore, the neural network 30 may comprise a second hidden layer 33 comprising m neurons, e.g. neuron n21, n22, n23 ... n2m. The NNA 1001 may simulate one of the neurons of an actual layer of the network 30, wherein the NNA 1001 may receive output values of neurons of a previous layer of the network 30. The previous layer may be the first hidden layer 32. The actual layer may be the second hidden layer 33.

The neural network 30 may be configured to process input signals of the neural network 30, such as input signals in1(t), in2(t), ... , ink(t). For example, each of the signals in1(t-n) ... , in1(t-1), in1(t), in2(t-n) ... , in2(t-1), in2(t), ink(t-n) ... , ink(t-1), ink(t) may be indicative of a respective pixel of an image that may be inputted at a respective time step t-n, ... t-1, t at the corresponding inputs in1, in2, ... , ink of the neural network 30. In the following the input signals of the neural network 30 are referred to as input signals of the neural network 30 and the input signals of the NNA 1001 are referred to as input signals.

Each signal of the input signals x(t-n) ... x(t-3), x(t-2), x(t-1), x(t) may be generated by the IC 1000 such that these input signals may each be equal to a scalar product of a first vector and a second vector. Entries of the first vector may represent each an output value of one of the neurons, e.g. the neurons n11, n12, n13 ... n1p, of a previous layer of the neural network 30, e.g. of the first hidden layer 32, at a respective time step t-n, ... , t-3, t-2, t-1, t. These output values may be floating-point numbers and may be referred to as out11(t-n) ... out11 (t-3), out11 (t-2), out11 (t-1), out11(t) as the output values of the first neuron n11 of the previous layer, as out12(t-n) ... out12 (t-3), out12 (t-2), out12 (t-1), out12 (t) as the output values of the second neuron n12 of the previous layer, as out13(t-n) ... out13 (t-3), out13 (t-2), out13 (t-1), out13 (t) as the output values of the third neuron n13 of the previous layer and as out1p (t-n) ... out1p (t-3), out1p (t-2), out1p (t-1), out1p (t) as the output values of the p-th neuron n1p of the previous layer at the respective time step t-n, ... , t-3, t-2, t-1, t.

Entries of the second vector may represent each a value of a weight, e.g. w11, w12, w13, ... , w1p, indicative of a strength of a connection between the neuron the NNA 1001 may simulate and a corresponding neuron of the previous layer, e.g. the neuron n11, n12, n13, ... , n1p. Analogously, if the NNA 1001 may simulate neuron n2i of the actual layer, the entries of the second vector may be each a value of a weight wi1 , wi2, wi3, ... , wip.

In one example, the NNA 1001 may simulate a first neuron of the actual layer, e.g. neuron n21, and after that may simulate a second neuron of the actual layer, e.g. neuron n22, and so forth and may simulate an m-th neuron of the actual layer, e.g. neuron n2m.

If the NNA 1001 may simulate the first neuron n21 of the second hidden layer 33, the current input signal may be x(t)=w11* out11 (t)+w12*out12 (t)+w13*out13 (t)+ ... +w1p*out1p (t). Accordingly, one of the previously received input signals x(t-n) may be x(t-n)=w11*out11 (t-n)+w12*out12 (t-n)+w13*out13 (t-n)+ ... +w1p*out1p (t-n). Of course, one of the output values of the neurons of the previous layer may be equal to zero. This may occur frequently, in case, the neurons of the previous layer are spiking neurons.

According to another example, the NNA 1001 may simulate one of the neurons of the first hidden layer 32, e.g. neuron n11. In this case, the current input signal may be x(t)=w011*in1 (t)+w012*in2 (t)+w013*in3 (t)+ ... +w01k* ink (t). Accordingly, one of the previously received input signals x(t-n) may be x(t-n)=w0l1*in1 (t-n)+w0l2*in2 (t-n)+w0l3*in3 (t-n)+ . . . +w0lk*ink (t-n).

The NNA 1001 may be configured to generate a current output signal of the NNA 1001 on the basis of the current input signal. For example, the NNA 1001 may comprise an activation function, for example a sigmoid or a rectified linear unit, to generate the current output signal. The current input signal may be used as an input signal of the activation function. In one example, the NNA 1001 may be configured to generate the current output signal on the basis of the current input signal and the previously received input signals. The current output signal may serve as a basis for simulating the network 30, specifically to generate an output signal of the IC 1000 which simulates a behavior of the network 30.

FIG. 13 illustrates the crossbar array 700 of memory elements 701 in detail. The memory elements 701 may be resistive memory elements (or resistive processing units (RPUs) that may comprise multiple resistive memory elements) and may also be referred to as memristors 701 in the following. The memristors 701 may provide local data storage within the IC 1000 for the weights $W_{ij}$ of the neural network 30. FIG. 13 is a two-dimensional (2D) diagram of the crossbar array 700 that may for example perform a matrix-vector multiplication as a function of the weights $W_{ij}$. The crossbar array 700 may be formed from a set of conductive row wires $702_1, 702_2 \ldots 702_n$ and a set of conductive column wires $708_1, 708_2 \ldots 708_m$ that may cross the set of the conductive row wires $702_{1-n}$. Regions where the column wires $708_{1-m}$ may cross the row wires $702_{1-n}$ are shown as intersections in FIG. 13 and may be referred to as intersections in the following. The IC 1000 may be designed such that there is no electrical contact between the column wires $708_{1-m}$ and the row wires $702_{1-n}$ at the intersections. For example, the column wires $708_{1-m}$ may be guided above or below the row wires $702_{1-n}$ at the intersections.

In the regions of the intersections the memristors 701 may be arranged with respect to the column wires $708_{1-m}$ and the row wires $702_{1-n}$ such that through each memristor 701 may flow a single electrical current if respective voltages $v_1 \ldots v_n$ may be applied to input connections $703_1, 703_2 \ldots 703_n$ of the crossbar 700 and by that may be applied to the row wires $702_{1-n}$. The memristors 701 are shown in FIG. 13 as resistive elements each having its own adjustable/updateable resistive conductance, depicted as $G_{ij}$ respectively where i=1 . . . m, and j=1 . . . n. Hence, in this example, each conductance $G_{ij}$, represents a respective physical quantity of the respective memristor $701_{ij}$. Each resistive conductance $G_{ij}$ may correspond to a corresponding weight $W_{ij}$ of the neural network 30.

Each column wire 708, may sum the single electrical currents $I_{i1}, I_{i2} \ldots I_{in}$ generated in the respective memristor $701_{i1}, 701_{i2} \ldots 701_{in}$ by applying the respective voltages $v_1 \ldots v_n$ to the corresponding input connections $703_1, 703_2 \ldots 703_n$. For example, as shown in FIG. 13, the current $I_i$ generated by the column wire $708_i$ is according to the equation $I_i=v_1 \cdot G_{i1}+v_2 \cdot G_{i2}+v_3 \cdot G_{i3}+ \ldots +v_n \cdot G_{in}$. A first output electric current $I_1$ generated by the column wire $708_1$ is according to the equation $I_1=v_1 \cdot G_{11}+v_2 \cdot G_{12}+v_3 \cdot G_{13}+ \ldots +v_n \cdot G_{1n}$. Thus, the array 700 computes the matrix-vector multiplication by multiplying the values stored in the memristors 701 by the row wire inputs, which are defined by voltages $v_{1-n}$. Accordingly, a single multiplication $v_j \cdot G_{ij}$ may be performed locally at each memristor $701_{ij}$ of the array 700 using the memristor $701_{ij}$ itself plus the relevant row or column wire of the array 700. The currents $I_{2-m}$ may be referred to as further output electric currents in the following.

The crossbar array 700 of FIG. 13 may for example enable to compute the multiplication of a vector x with a matrix W. The matrix W may comprise entries $W_{ij}$. The entries $W_{ij}$ of the matrix W may be mapped onto corresponding conductances of the crossbar array as follows:

$$W_{ij} = \frac{W_{max}}{G_{max}} G_{ij},$$

where $G_{max}$ is given by the conductance range of the crossbar array 700 and $W_{max}$ is chosen depending on the magnitude of matrix W. The entries of the matrix W may be equal to the weights $W_{ij}$ of the neural network 30 or wij as denoted above. The vector x may correspond to the voltages $v_1 \ldots v_n$. The IC 1000 may be configured to generate the respective voltages $v_1 \ldots v_n$ as a function of the corresponding output values out11 (t), out12 (t), out13 (t) . . . outp (t) of the neurons of the previous layer, for example the first hidden layer 32.

FIG. 13 illustrates one example of a first assembly 704 of the resistive memory elements $701_{11}, 701_{12} \ldots 701_{1n}$ of the IC 1000. The first assembly 704 may comprise the input connections $703_1, 703_2 \ldots 703_n$ for applying the corresponding voltages $v_1 \ldots v_n$ to the respective input connections $703_1, 703_2 \ldots 703_n$ to generate the single electric currents $I_{11}, I_{12} \ldots I_{1n}$ in the respective resistive memory elements $701_{11}, 701_{12} \ldots 701_{1n}$ and a first output connection $705_1$ for outputting a first output electric current $I_1$. The memristors $701_{11}, 701_{12} \ldots 701_{1n}$, may be connected to each other such that the first output electric current $I_1$ is a sum of the single electric currents $I_{11}, I_{12} \ldots I_{1n}$. Such a connection between the memory elements $701_{11}, 701_{12} \ldots 701_{1n}$ may be provided by the row wires $702_{1-n}$ and the first column wire $708_1$. A value of the first output electric current $I_1$the may represent a value of a first scalar product to compute an output value of the neural network 30 by means of a propagation of values through the layers of the network 30. The first scalar product may, for example, be equal to or be a multiple or a fraction of x(t)=w11*out11 (t)+w12*out12 (t)+w13*out13 (t)+ . . . +w1p*out1p (t) or x(t)=w0l1*in1 (t)+w0l2*in2 (t)+w0l3*in3 (t) + . . . +w0lk*ink (t). In the former case the NNA 1001 may simulate the neuron n21 in the latter case the neuron n11. Furthermore, in the former case, the number of row wires n may be equal to p, in the latter case, the number of row wires n may be equal to k.

The first output connection $705_1$ of the first assembly 704 may be coupled to an input 13 of the NNA 1001. The IC 1000 may be configured to generate the current input signal x(t) on the basis of the first output electric current $I_1$. In one example, the NNA 1001 may be configured to process the input signal x(t) as an analog signal. In that case, the first output electric current $I_1$ may be the current input signal x(t).

In another example, the IC 1000 may be configured to generate the current input signal x(t) on the basis of the first output electric current $I_1$ by means of an analog digital converter 706 (ADC 706). In one example, the NNA 1001 may receive the current input signal x(t) only from the first output connection $705_1$. This example may refer to an application wherein the NNA 1001 may simulate an output neuron of an output layer 34 of the neural network 30. In this example, the other column wires $708_{2-m}$ may not be needed.

In case, the IC 1000 may be used to simulate a layer of the network 30 which comprises more than one neuron, e.g. the first hidden layer 32 or the second hidden layer 33, more than one column wires of the crossbar 700 are needed. A number of the column wires 708$_{1-m}$ may be equal to a number of neurons m of that layer, the IC 1000 may simulate. A number of the row wires 702$_{1-n}$ may be equal to a number of neurons of the previous layer of the network 30. If the previous layer is the input layer 31, the number of row wires n may be equal to k. If the previous layer is the first hidden layer 32, the number of row wires n may be equal to p.

Figure 14:
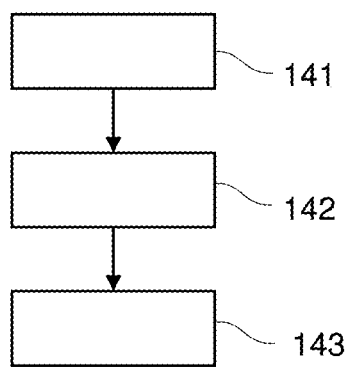
FIG. 14 is a flowchart of a method for setting-up a storage device.

FIG. 14 is a flowchart of a method for setting-up a storage device comprising a memory element with a changeable physical quantity, such as one or more memristors 701$_{ij}$ of the crossbar array 700. The crossbar array 700 may be the storage device. This method, in the following referred to as set-up-method, may comprise setting-up the physical quantity of the memory element, for example the conductance of one or more memristors 701$_{ij}$ of the crossbar array 700. The set-up-method may comprise the following steps.

In a first step 141 of the set-up-method, a target state of the physical quantity may be selected. Referring to the above described use case, a respective target state of the conductance of each RME 701$_{ij}$ of the crossbar array 700 may be equal to $G_{ij}$ in order to provide a representation of the weights $W_{ij}$ of the neural network 30 by means of the conductance values of the RME 701$_{ij}$.

In a second step 142 of the set-up-method, an initial state of the physical quantity, for example the conductance of the RME 704, may be computed using an initialization function. The initialization function may be dependent on the target state of the physical quantity. For example, the initialization function 200 may be the visual representation 720 of initialization function 200 as shown in FIG. 7. Referring to the above described use case, the respective target state of the conductance $G_{ij}$ of each RME 701$_{ij}$ may be set one after another equal to the selected target state $G_{target\_sel}$ shown in the chart of FIG. 7. For each RME 701$_{ij}$ a corresponding initial state of the conductance $G_{init\_sel}$ of the respective RME 701$_{ij}$ may be computed on the basis of the selected target state $G_{target\_sel}$ using the initialization function 200. The corresponding initial state of the conductance $G_{init\_sel}$ of each RME 701 may be referred to as $G_{ij\_init}$ in the following.

In a third step 143 of the set-up-method, the physical quantity may be set to the computed initial state of the physical quantity. Referring to the above described use case, the conductance of each RME 701$_{ij}$ may be set to the corresponding initial state of the conductance $G_{ij\_init}$. This may be realized by applying a programming voltage or current to each RME 701$_{ij}$. A point of time when a setting of the conductance of each RME 701$_{ij}$ to the corresponding initial state of the conductance may be performed may be referred to as point of time of setting in the following.

After the third step 143 of the set-up-method, the value of the physical quantity, for example the conductance of each RME 701$_{ij}$, may drift, for example decay, with respect to time from the corresponding initial state of the physical quantity, for example the conductance in direction to the respective target state of the physical quantity, for example the conductance $G_{ij}$ of each RME 701$_{ij}$, similar to the respective curves of the chart of FIG. 5. In one example, the conductance of each RME 701$_{ij}$ may be in a drifted, especially in a decayed, state after the given period of time ΔT has passed after the point of time of setting. The drifted state of the conductance of each RME 701$_{ij}$ may be approximately equal to the respective target state of the conductance $G_{ij}$ of each RME 701$_{ij}$. For example, a value of the conductance of each RME 701$_{ij}$ in the decayed state may deviate from the respective target state of the conductance $G_{ij}$ of each RME 701$_{ij}$ less than ten percent. According to a further example, the value of the conductance of each RME 701$_{ij}$ in the decayed state may deviate from the respective target state of the conductance $G_{ij}$ of each RME 701$_{ij}$ less than one percent.

Hence, the respective RME 701$_{ij}$ may be configured for setting the respective conductance of the RME 701$_{ij}$ to a respective initial state $G_{ij\_init}$ and to comprise a respective drift of the respective conductance of the RME 701$_{ij}$ from the respective initial state $G_{ij\_init}$ to the respective drifted state. The respective initial state of the respective conductance may be computable by a processor by means of a respective initialization function. The respective initialization function may be different for each RME 701$_{ij}$ in one example. In another example, the respective initialization function may be the same for each RME 701$_{ij}$, for example the initialization function 200. The processor may be an external processor or may be implemented on the IC 1000. The processor may store the parameters or coefficients of the initialization function in order to compute the respective initial state $G_{ij\_init}$ of each RME 701$_{ij}$ on the basis of the respective target state of the conductance $G_{ij}$ of each RME 701$_{ij}$.

The set-up-method may further comprise measuring an elapsed time from an initial point of time of setting the conductance to the computed initial state of the conductance to an actual point of time. Furthermore, the set-up-method may comprise comparing the measured elapsed time with a further given period of time. The further given period of time may depend on a usage of the memory element, for example on a usage of the crossbar array 700. The set-up-method may comprise releasing the memory element for operation if the measured elapsed time is greater than the further given period of time.

For example, the voltages $v_{1-n}$ may not be applied to the input connections 703$_1$, 703$_2$ ... 703$_n$ till the elapsed time is greater than the further given period of time. Or, in other words, the voltages $v_{1-n}$ may be applied to the input connections 703$_1$, 703$_2$ ... 703$_n$ if the elapsed time is greater than the further given period of time. In one example, the voltages $v_{1-n}$ may be applied to the input connections 703$_1$, 703$_2$ ... 703$_n$ only if the elapsed time is greater than the further given period of time.

The further given period of time may correspond to the above mentioned given period of time ΔT. By that, knowledge of the experiments for retrieving the initialization function 200 may be used. In most cases, the given period of time ΔT may be chosen such that a further drift of the physical quantity, for example a further decay of the conductance, over time after the given period of time ΔT has passed may be low compared to a drift of the physical quantity, for example a decay of the conductance, over time directly after programming the physical quantity, for example the conductance, to the initial state.

In one example, the respective initial state $G_{ij\_init}$ of the conductance of each RME 701$_{ij}$ may be computed on the basis of the respective target state of the conductance $G_{ij}$ of each RME 704 and a respective selected point of time of operation of each RME 701$_{ij}$ on the basis of the global initialization function 900. The respective selected points of time of operation of each RME 701$_{ij}$ may be equal in one example. In another example, the respective selected points of time of operation of each RME 701$_{ij}$ may differ from each other. This may be practical, if each respective point of time of operation of each RME $701_{ij}$ may be known in advance.

For example, a multi-core-architecture may comprise several cores, wherein each core may be designed in the form of the IC 1000. A second core of the cores may be configured to simulate the second hidden layer 33 and a first core of the cores may be configured to simulate a previous layer, for example the first hidden layer 32. As a simulation of the network 30 may start with a simulation of the first hidden layer 32 and may progress with a simulation of the second hidden layer 33, a first point of time of usage of the first core may be earlier than a second point of time of usage of the second core. Therefore, in one example, the respective conductance of the RME $701_{ij}$ of the first core may be set to the respective initial state $G_{ij\_init}$ of the conductance such that each respective conductance of the RME $701_{ij}$ of the first core may reach its respective target state of the conductance $G_{ij}$ earlier than each of the respective conductance of the RME $701_{ij}$ of the second core may reach its respective target state of the conductance $G_{ij}$.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method for designing an initialization function, the initialization function representing a relationship between a respective selected target state of a changeable physical quantity of a memory element for storing information and a corresponding initial state of the physical quantity of the memory element, wherein the physical quantity of the memory element is adjustable to the corresponding initial state of the physical quantity for drifting in direction to the respective selected target state of the physical quantity, the method comprising:

setting the physical quantity of the memory element to an initial value at an initial point of time in a first step;

measuring an actual value of the physical quantity of the memory element after an elapsed given period of time in a second step, wherein the elapsed given period of time starts from the initial point of time;

storing the initial value and the actual value of the physical quantity in a database in a third step;

repeating the first, second and third step and setting the physical quantity of the memory element to a different initial value at each repetition of the first step for storing several different pairs of the initial and the actual value of the physical quantity in the database; and designing the initialization function on the basis of the database, wherein the initialization function is a power function, and wherein the power function comprises the respective selected target state of the changeable physical quantity as an exponent of the power function and the corresponding initial state of the physical quantity as a function value of the power function.

2. The computer-implemented method of claim 1, wherein the measuring of the actual value of the physical quantity of the memory element in the second step is performed at a first point of time, wherein a time span between the initial point of time and the first point of time is equal to the given period of time.

3. The computer-implemented method of claim 1, wherein the given period of time is adapted to a future usage of the memory element.

4. The computer-implemented method of claim 1, wherein the measuring of the actual value of the physical quantity of the memory element in the second step is performed if a change over time of the actual value of the physical quantity is below a given threshold.

5. The computer-implemented method of claim 1, wherein the initialization function is independent of time.

6. The computer-implemented method of claim 5, the initialization function being equal to: $f(G)=a*e^{-b*G}+c$, wherein G is the respective selected target state of the changeable physical quantity, f (G) is the corresponding initial state of the physical quantity and a, b and c are coefficients of the initialization function.

7. The computer-implemented method of claim 1, the method further comprising:

measuring a further actual value of the physical quantity of the memory element and an actual period of time, the actual period of time being defined by an elapsed time between the initial point of time and an actual point of time in a sub-step of the second step;

storing the further actual value of the physical quantity and the actual period of time in the database in a further sub-step of the second step;

repeating the sub-step and the further sub-step of the second step while time elapses from the initial point of time for storing several different further actual values of the physical quantity and corresponding actual periods of time in the database; and designing the initialization function on the basis of the database.

8. The computer-implemented method of claim 7, the method further comprising designing a corresponding time-dependent initialization function for each initial value of the physical quantity, the corresponding time-dependent initialization function representing a time-dependent drift of the physical quantity of the memory element starting from the corresponding initial state of the physical quantity of the memory element.

9. The computer-implemented method of claim 7, the method further comprising designing the initialization function such that the initialization function represents the relationship between the respective selected target state of the changeable physical quantity of the memory element and the corresponding initial state of the physical quantity of the memory element and a selected elapsed period of time after setting the physical quantity of the memory element to the corresponding initial state, the selected elapsed period of time being dependent on a predefined future usage of the memory element.

10. A computer system for designing an initialization function, the initialization function representing a relationship between a respective selected target state of a changeable physical quantity of a memory element for storing information and a corresponding initial state of the physical quantity of the memory element, wherein the physical quantity of the memory element is adjustable to the corresponding initial state of the physical quantity for drifting in direction to the respective selected target state of the physical quantity, the computer system comprising:

one or more computer processors;

one or more computer readable storage media; and program instructions, stored on the one or more computer readable storage media for execution by at least one of the one or more computer processors, the program instructions comprising:

program instructions to set the physical quantity of the memory element to an initial value at an initial point of time in a first step;

program instructions to measure an actual value of the physical quantity of the memory element after an elapsed given period of time in a second step, wherein the elapsed given period of time starts from the initial point of time;

program instructions to store the initial value and the actual value of the physical quantity in a database in a third step;

program instructions to repeat the first, second and third step and setting the physical quantity of the memory element to a different initial value at each repetition of the first step for storing several different pairs of the initial and the actual value of the physical quantity in the database; and program instructions to design the initialization function on the basis of the database, wherein the initialization function is a power function, and wherein the power function comprises the respective selected target state of the changeable physical quantity as an exponent of the power function and the corresponding initial state of the physical quantity as a function value of the power function.

11. The computer system claim 10, wherein the measuring of the actual value of the physical quantity of the memory element in the second step is performed at a first point of time, wherein a time span between the initial point of time and the first point of time is equal to the given period of time.

12. The computer system of claim 10, wherein the given period of time is adapted to a future usage of the memory element.

13. A computer program product for designing an initialization function, the initialization function representing a relationship between a respective selected target state of a changeable physical quantity of a memory element for storing information and a corresponding initial state of the physical quantity of the memory element, wherein the physical quantity of the memory element is adjustable to the corresponding initial state of the physical quantity for drifting in direction to the respective selected target state of the physical quantity, the computer program product comprising:

one or more computer readable storage media; and program instructions stored on the one or more computer readable storage media, the program instructions comprising:

program instructions to set the physical quantity of the memory element to an initial value at an initial point of time in a first step;

program instructions to measure an actual value of the physical quantity of the memory element after an elapsed given period of time in a second step, wherein the elapsed given period of time starts from the initial point of time;

program instructions to store the initial value and the actual value of the physical quantity in a database in a third step;

program instructions to repeat the first, second and third step and setting the physical quantity of the memory element to a different initial value at each repetition of the first step for storing several different pairs of the initial and the actual value of the physical quantity in the database; and program instructions to design the initialization function on the basis of the database, wherein the initialization function is a power function, and wherein the power function comprises the respective selected target state of the changeable physical quantity as an exponent of the power function and the corresponding initial state of the physical quantity as a function value of the power function.

14. The computer program product claim 13, wherein the measuring of the actual value of the physical quantity of the memory element in the second step is performed at a first point of time, wherein a time span between the initial point of time and the first point of time is equal to the given period of time.

15. The computer program product of claim 13, wherein the given period of time is adapted to a future usage of the memory element.

* * * * *